US010461762B1

(12) United States Patent
Zargham et al.

(10) Patent No.: US 10,461,762 B1
(45) Date of Patent: Oct. 29, 2019

(54) SUCCESSIVE APPROXIMATION REGISTER ANALOG-TO-DIGITAL CONVERTER CHOPPING

(71) Applicant: QUALCOMM Incorporated, San Diego, CA (US)

(72) Inventors: Mohammad Meysam Zargham, San Diego, CA (US); Yan Wang, San Diego, CA (US); Li Lu, San Diego, CA (US); Dinesh Jagannath Alladi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/051,686

(22) Filed: Aug. 1, 2018

(51) Int. Cl.
H03M 1/06 (2006.01)
H03M 1/00 (2006.01)

(52) U.S. Cl.
CPC ......... *H03M 1/0617* (2013.01); *H03M 1/002* (2013.01)

(58) Field of Classification Search
CPC .......................... H03M 1/002; H03M 1/0617
USPC .................................. 341/118, 163; 375/376
See application file for complete search history.

(56) References Cited

U.S. PATENT DOCUMENTS

| | | | | |
|---|---|---|---|---|
| 9,998,131 B1* | 6/2018 | Kinyua | .................. | H03F 3/45 |
| 10,097,198 B1* | 10/2018 | Lee | .................. | H03M 1/466 |
| 2004/0233093 A1* | 11/2004 | Confalonieri | ....... | H03M 1/0682 |
| | | | | 341/172 |
| 2009/0273501 A1* | 11/2009 | Madhavan | ............ | H03M 1/068 |
| | | | | 341/158 |
| 2012/0154193 A1* | 6/2012 | Chang | .................... | H03M 1/145 |
| | | | | 341/156 |
| 2012/0218137 A1* | 8/2012 | Yoon | ...................... | H03M 1/16 |
| | | | | 341/172 |
| 2012/0280846 A1* | 11/2012 | Lin | ...................... | H03M 1/002 |
| | | | | 341/172 |
| 2013/0076553 A1* | 3/2013 | Kuo | ...................... | H03M 1/466 |
| | | | | 341/172 |
| 2013/0147649 A1* | 6/2013 | Cheong | .............. | H03M 1/0682 |
| | | | | 341/172 |
| 2015/0280730 A1* | 10/2015 | Tanaka | .................. | H03M 1/066 |
| | | | | 73/514.32 |
| 2016/0226507 A1* | 8/2016 | Baek | ...................... | H03M 1/38 |
| 2018/0091163 A1* | 3/2018 | Fan | ...................... | H03M 1/002 |
| 2019/0020351 A1* | 1/2019 | Fan | ...................... | H03M 1/804 |

* cited by examiner

*Primary Examiner* — Lam T Mai
(74) *Attorney, Agent, or Firm* — Patterson & Sheridan, L.L.P.

(57) ABSTRACT

Methods and apparatuses for chopping a successive approximation register (SAR) analog-to-digital converter (ADC). The ADC generally includes a comparator comprising a first input and a second input; a switch connected between the first and second inputs of the comparator; a first capacitive array having a first terminal selectively coupled to the first input of the comparator; a second capacitive array having a first terminal selectively coupled to the second input of the comparator; and a reference buffer selectively coupled to second terminals of the first and second capacitive arrays and configured to apply inverse digital codes to the first and second capacitive arrays, wherein the switch is configured to short the first and second inputs of the comparator while the inverse digital codes are being applied to the first and second capacitive arrays such that charges of the first and second capacitive arrays are redistributed via the reference buffer.

20 Claims, 9 Drawing Sheets

SUCCESSIVE APPROXIMATION REGISTER ANALOG-TO-DIGITAL CONVERTER CHOPPING

FIELD OF THE DISCLOSURE

Certain aspects of the present disclosure generally relate to electronic circuits and, more particularly, to a successive approximation register (SAR) analog-to-digital converter (ADC).

DESCRIPTION OF RELATED ART

Wireless communication networks are widely deployed to provide various communication services such as telephony, video, data, messaging, broadcasts, and so on. Such networks, which are usually multiple access networks, support communications for multiple users by sharing the available network resources. A wireless communication network may include a number of base stations that can support communication for a number of user equipments. A user equipment (UE) may communicate with a base station (BS) via a downlink and an uplink. The UE and/or BS may include a radio frequency front-end (RFFE) for transmitting and/or receiving radio frequency (RF) signals, and the receive path of the RFFE may include any of various suitable types of analog-to-digital converters (ADCs).

Several types of ADCs are available, each with varying advantages and disadvantages. For example, a successive approximation register (SAR) ADC may provide an area and power-efficient architecture for low to medium accuracy analog-to-digital conversion applications. A SAR ADC may use a digital-to-analog converter (DAC) and a comparator to approximate a digital value corresponding to an analog input.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include an improved SAR ADC.

Certain aspects of the present disclosure provide an analog-to-digital converter (ADC). The ADC generally includes a comparator comprising a first input and a second input; a switch connected between the first and second inputs of the comparator; a first capacitive array having a first terminal selectively coupled to the first input of the comparator; a second capacitive array having a first terminal selectively coupled to the second input of the comparator; and a reference buffer selectively coupled to second terminals of the first and second capacitive arrays and configured to apply inverse digital codes to the first and second capacitive arrays, wherein the switch is configured to short the first and second inputs of the comparator while the inverse digital codes are being applied to the first and second capacitive arrays such that charges of the first and second capacitive arrays are redistributed via the reference buffer.

Certain aspects of the present disclosure provide a method for converting an analog signal to a digital signal using an ADC. The method generally includes coupling a first terminal of a first capacitive array to a first input of a comparator; coupling a first terminal of a second capacitive array to a second input of the comparator; applying inverse codes to second terminals of the first and second capacitive arrays; and shorting the first and second inputs of the comparator while the inverse codes are being applied to the second terminals of the first and second capacitive arrays to redistribute charges of the first and second capacitive arrays.

Certain aspects of the present disclosure provide an apparatus. The apparatus generally includes means for comparing a first input and a second input; means for shorting the first input and the second input together; first means for sampling and converting a first component of a differential signal pair coupled to the first input of the means for comparing; second means for sampling and converting a second component of the differential signal pair coupled to the second input of the means for comparing; and means for selectively applying inverse digital codes to the first and second means for sampling and converting, wherein the means for shorting is configured to short the first and second inputs of the means for comparing while the inverse digital codes are being applied to the first and second means for sampling and comparing such that charges of the first and second means for sampling and converting are redistributed via the means for selectively applying inverse digital codes.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
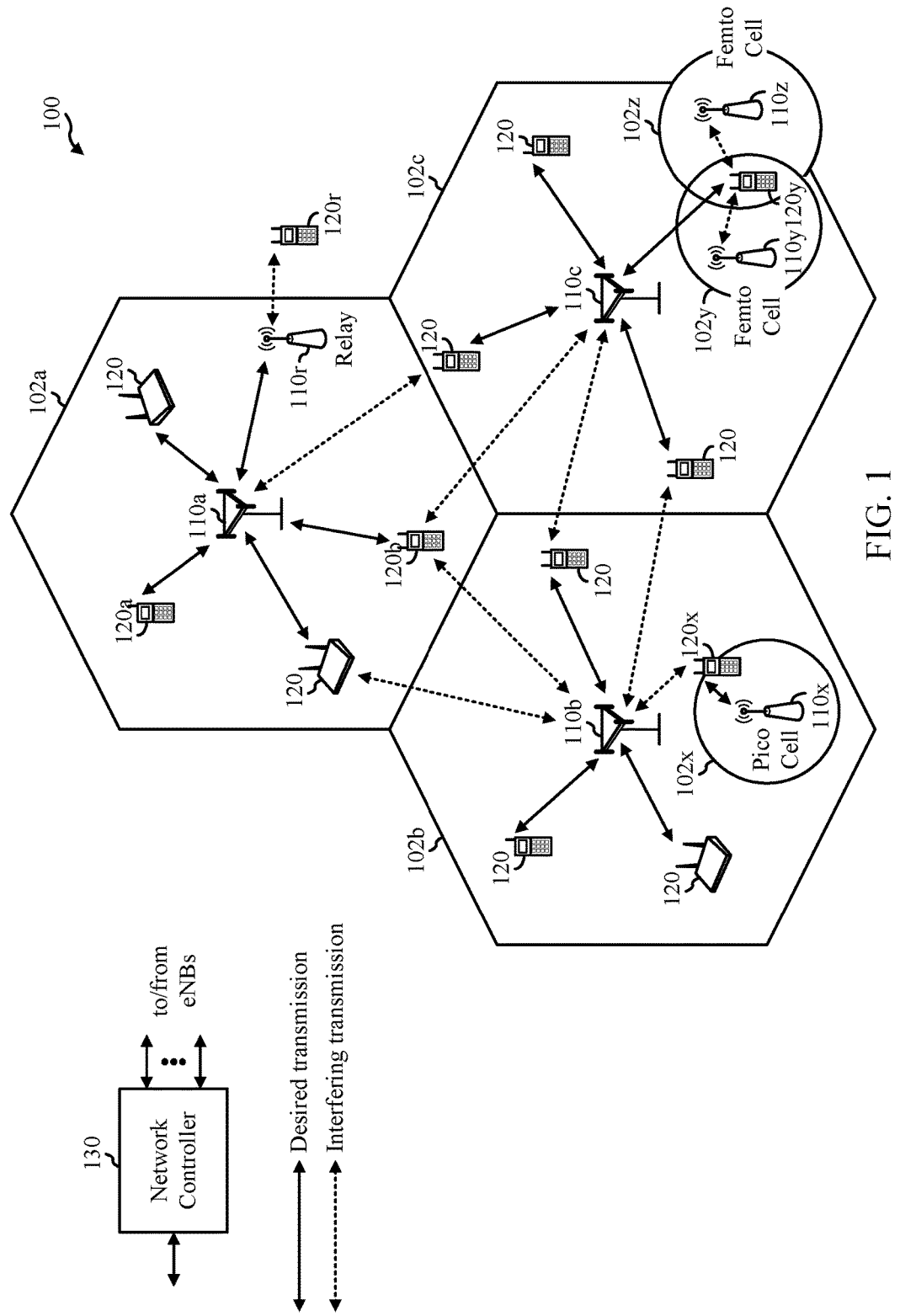
FIG. 1 is a block diagram conceptually illustrating an example telecommunications system, in accordance with certain aspects of the present disclosure.

Aspects of the present disclosure provide apparatus and methods for chopping an input signal applied to a SAR ADC.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The techniques described herein may be used for various wireless communication technologies, such as LTE, CDMA, TDMA, FDMA, OFDMA, SC-FDMA and other networks. The terms "network" and "system" are often used interchangeably. A CDMA network may implement a radio technology such as Universal Terrestrial Radio Access (UTRA), cdma2000, etc. UTRA includes Wideband CDMA (WCDMA) and other variants of CDMA. cdma2000 covers IS-2000, IS-95 and IS-856 standards. A TDMA network may implement a radio technology such as Global System for Mobile Communications (GSM). An OFDMA network may implement a radio technology such as NR (e.g. 5G RA), Evolved UTRA (E-UTRA), Ultra Mobile Broadband (UMB), IEEE 802.11 (Wi-Fi), IEEE 802.16 (WiMAX), IEEE 802.20, Flash-OFDMA, etc. UTRA and E-UTRA are part of Universal Mobile Telecommunication System (UMTS).

New Radio (NR) is an emerging wireless communications technology under development in conjunction with the 5G Technology Forum (SGTF). 3GPP Long Term Evolution (LTE) and LTE-Advanced (LTE-A) are releases of UMTS that use E-UTRA. UTRA, E-UTRA, UMTS, LTE, LTE-A and GSM are described in documents from an organization named "3rd Generation Partnership Project" (3GPP). cdma2000 and UMB are described in documents from an organization named "3rd Generation Partnership Project 2" (3GPP2). The techniques described herein may be used for the wireless networks and radio technologies mentioned above as well as other wireless networks and radio technologies. For clarity, while aspects may be described herein using terminology commonly associated with 3G and/or 4G wireless technologies, aspects of the present disclosure can be applied in other generation-based communication systems, such as 5G and later, including NR technologies.

NR access (e.g., 5G technology) may support various wireless communication services, such as enhanced mobile broadband (eMBB) targeting wide bandwidth (e.g., 80 MHz or beyond), millimeter wave (mmW) targeting high carrier frequency (e.g., 25 GHz or beyond), massive machine type communications MTC (mMTC) targeting non-backward compatible MTC techniques, and/or mission critical targeting ultra-reliable low-latency communications (URLLC). These services may include latency and reliability requirements. These services may also have different transmission time intervals (TTI) to meet respective quality of service (QoS) requirements. In addition, these services may co-exist in the same subframe.

Example Wireless Communication System

FIG. 1 illustrates an example wireless communication network 100 in which aspects of the present disclosure may be performed. For example, the wireless communication network 100 may be a New Radio (NR) or 5G network. Wireless devices in the wireless network 100 may be equipped with the SAR ADC described herein to reduce comparator flicker noise and effects of input settling as further described herein.

As illustrated in FIG. 1, the wireless network 100 may include a number of base stations (BSs) 110 and other network entities. A BS may be a station that communicates with user equipments (UEs). Each BS 110 may provide communication coverage for a particular geographic area. In 3GPP, the term "cell" can refer to a coverage area of a Node B (NB) and/or a Node B subsystem serving this coverage area, depending on the context in which the term is used. In NR systems, the term "cell" and next generation Node B (gNB), new radio base station (NR BS), 5G NB, access point (AP), or transmission reception point (TRP) may be interchangeable. In some examples, a cell may not necessarily be stationary, and the geographic area of the cell may move according to the location of a mobile BS. In some examples, the base stations may be interconnected to one another and/or to one or more other base stations or network nodes (not shown) in wireless communication network 100 through various types of backhaul interfaces, such as a direct physical connection, a wireless connection, a virtual network, or the like using any suitable transport network.

In general, any number of wireless networks may be deployed in a given geographic area. Each wireless network may support a particular radio access technology (RAT) and may operate on one or more frequencies. A RAT may also be referred to as a radio technology, an air interface, etc. A frequency may also be referred to as a carrier, a subcarrier, a frequency channel, a tone, a subband, etc. Each frequency may support a single RAT in a given geographic area in order to avoid interference between wireless networks of different RATs. In some cases, NR or 5G RAT networks may be deployed.

A base station (BS) may provide communication coverage for a macro cell, a pico cell, a femto cell, and/or other types of cells. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having an association with the femto cell (e.g., UEs in a Closed Subscriber Group (CSG), UEs for users in the home, etc.). A BS for a macro cell may be referred to as a macro BS. A BS for a pico cell may be referred to as a pico BS. A BS for a femto cell may be referred to as a femto BS or a home BS. In the example shown in FIG. 1, the BSs 110a, 110b and 110c may be macro BSs for the macro cells 102a, 102b and 102c, respectively. The BS 110x may be a pico BS for a pico cell 102x. The BSs 110y and 110z may be femto BSs for the femto cells 102y and 102z, respectively. A BS may support one or multiple (e.g., three) cells.

Wireless communication network 100 may also include relay stations. A relay station is a station that receives a transmission of data and/or other information from an upstream station (e.g., a BS or a UE) and sends a transmission of the data and/or other information to a downstream station (e.g., a UE or a BS). A relay station may also be a UE that relays transmissions for other UEs. In the example shown in FIG. 1, a relay station 110r may communicate with the BS 110a and a UE 120r in order to facilitate communication between the BS 110a and the UE 120r. A relay station may also be referred to as a relay BS, a relay, etc.

Wireless network 100 may be a heterogeneous network that includes BSs of different types, e.g., macro BS, pico BS, femto BS, relays, etc. These different types of BSs may have different transmit power levels, different coverage areas, and different impact on interference in the wireless network 100. For example, a macro BS may have a high transmit power level (e.g., 20 watts (W)) whereas a pico BS, a femto BS, and relays may have a lower transmit power level (e.g., 1 W).

Wireless communication network 100 may support synchronous or asynchronous operation. For synchronous operation, the BSs may have similar frame timing, and transmissions from different BSs may be approximately aligned in time. For asynchronous operation, the BSs may have different frame timing, and transmissions from different BSs may not be aligned in time. The techniques described herein may be used for both synchronous and asynchronous operation.

A network controller 130 may couple to a set of BSs and provide coordination and control for these BSs. The network controller 130 may communicate with the BSs 110 via a backhaul. The BSs 110 may also communicate with one another (e.g., directly or indirectly) via wireless or wireline backhaul.

The UEs 120 (e.g., 120x, 120y, etc.) may be dispersed throughout the wireless network 100, and each UE may be stationary or mobile. A UE may also be referred to as a mobile station (MS), a terminal, an access terminal, a subscriber unit, a station, a Customer Premises Equipment (CPE), a cellular phone, a smart phone, a personal digital assistant (PDA), a wireless modem, a wireless communication device, a handheld device, a laptop computer, a cordless phone, a wireless local loop (WLL) station, a tablet computer, a camera, a gaming device, a netbook, a smartbook, an ultrabook, an appliance, a medical device or medical equipment, a biometric sensor/device, a wearable device such as a smart watch, smart clothing, smart glasses, a smart wrist band, smart jewelry (e.g., a smart ring, a smart bracelet, etc.), an entertainment device (e.g., a music device, a video device, a satellite radio, etc.), a vehicular component or sensor, a smart meter/sensor, industrial manufacturing equipment, a Global Positioning System (GPS) device, or any other suitable device that is configured to communicate via a wireless or wired medium. Some UEs may be considered machine-type communication (MTC) devices or evolved MTC (eMTC) devices. MTC and eMTC UEs include, for example, robots, drones, remote devices, sensors, meters, monitors, location tags, etc., that may communicate with a BS, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices, which may be narrowband IoT (NB-IoT) devices.

Certain wireless networks (e.g., LTE) utilize orthogonal frequency division multiplexing (OFDM) on the downlink and single-carrier frequency division multiplexing (SC-FDM) on the uplink. OFDM and SC-FDM partition the system bandwidth into multiple (K) orthogonal subcarriers, which are also commonly referred to as tones, bins, etc. Each subcarrier may be modulated with data. In general, modulation symbols are sent in the frequency domain with OFDM and in the time domain with SC-FDM. The spacing between adjacent subcarriers may be fixed, and the total number of subcarriers (K) may be dependent on the system bandwidth. For example, the spacing of the subcarriers may be 15 kHz, and the minimum resource allocation (called a "resource block" (RB)) may be 12 subcarriers (or 180 kHz). Consequently, the nominal Fast Fourier Transfer (FFT) size may be equal to 128, 256, 512, 1024 or 2048 for a system bandwidth of 1.25, 2.5, 5, 10, or 20 megahertz (MHz), respectively. The system bandwidth may also be partitioned into subbands. For example, a subband may cover 1.08 MHz (i.e., 6 resource blocks), and there may be 1, 2, 4, 8, or 16 subbands for a system bandwidth of 1.25, 2.5, 5, 10 or 20 MHz, respectively.

While aspects of the examples described herein may be associated with LTE technologies, aspects of the present disclosure may be applicable with other wireless communications systems, such as NR. NR may utilize OFDM with a cyclic prefix (CP) on the uplink and downlink and include support for half-duplex operation using time-division duplexing (TDD). Beamforming may be supported, and beam direction may be dynamically configured. Multiple-input, multiple-output (MIMO) transmissions with precoding may also be supported. MIMO configurations in the downlink (DL) may support up to 8 transmit antennas with multi-layer DL transmissions up to 8 streams and up to 2 streams per UE. Aggregation of multiple cells may be supported with up to 8 serving cells.

In some examples, access to the air interface may be scheduled, wherein a scheduling entity (e.g., a base station) allocates resources for communication among some or all devices and equipment within its service area or cell. The scheduling entity may be responsible for scheduling, assigning, reconfiguring, and releasing resources for one or more subordinate entities. That is, for scheduled communication, subordinate entities utilize resources allocated by the scheduling entity. Base stations are not the only entities that may function as a scheduling entity. In some examples, a UE may function as a scheduling entity and may schedule resources for one or more subordinate entities (e.g., one or more other UEs), and the other UEs may utilize the resources scheduled by the UE for wireless communication. In some examples, a UE may function as a scheduling entity in a peer-to-peer (P2P) network, and/or in a mesh network. In a mesh network example, UEs may communicate directly with one another in addition to communicating with a scheduling entity.

In FIG. 1, a solid line with double arrows indicates desired transmissions between a UE and a serving BS, which is a BS designated to serve the UE on the downlink and/or uplink. A finely dashed line with double arrows indicates interfering transmissions between a UE and a BS.

Figure 2:
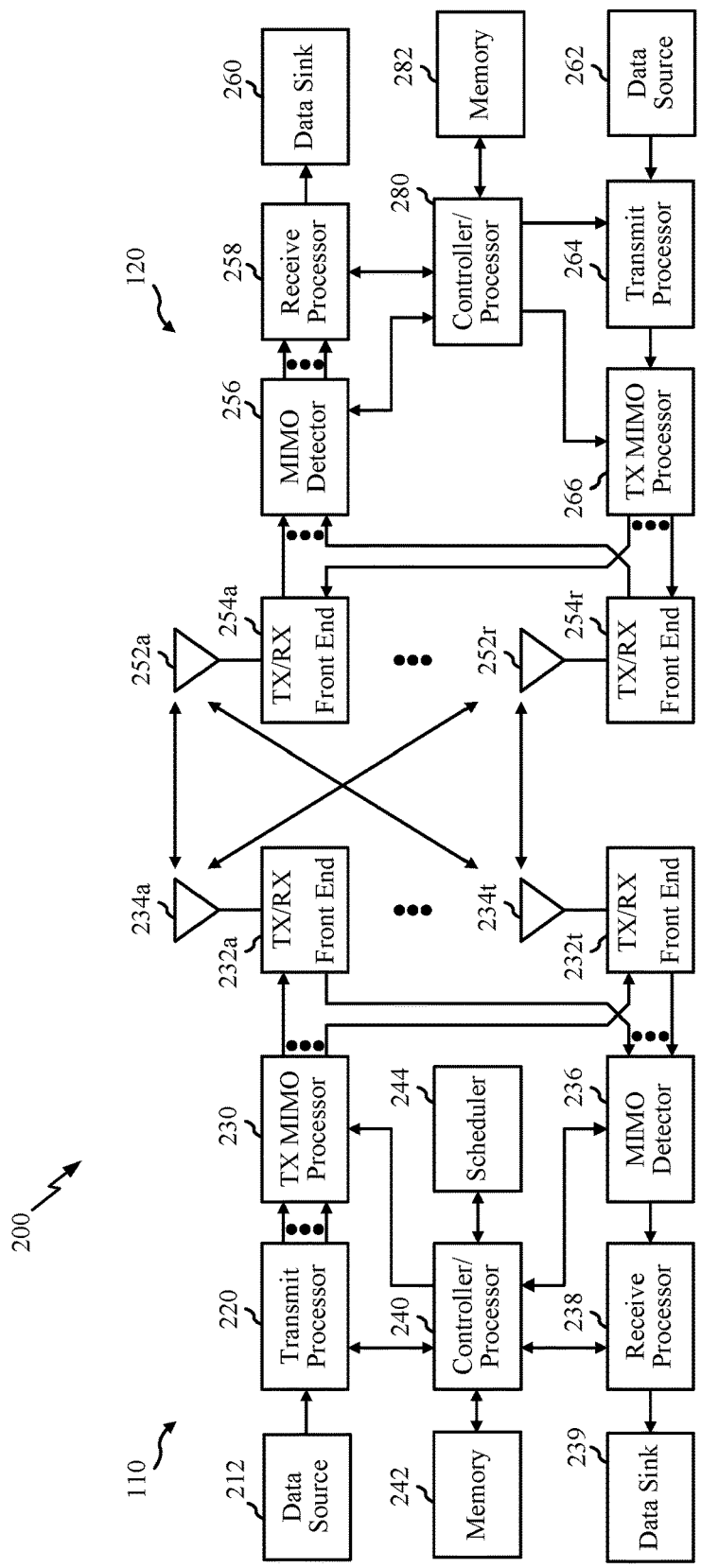
FIG. 2 is a block diagram conceptually illustrating a design of an example base station (BS) and an example user equipment (UE), in accordance with certain aspects of the present disclosure.

FIG. 2 illustrates example components of BS 110 and UE 120 (as depicted in FIG. 1), which may be used to implement aspects of the present disclosure. For example, antennas 252, processors 266, 258, 264, and/or controller/processor 280 of the UE 120 and/or antennas 234, processors 220, 240, 238, and/or controller/processor 240 of the BS 110 may be used to perform the various techniques and methods described herein (e.g., operations 800 of FIG. 8).

At the BS 110, a transmit processor 220 may receive data from a data source 212 and control information from a controller/processor 240. The control information may be for the physical broadcast channel (PBCH), physical control format indicator channel (PCFICH), physical hybrid ARQ indicator channel (PHICH), physical downlink control channel (PDCCH), group common PDCCH (GC PDCCH), etc. The data may be for the physical downlink shared channel (PDSCH), etc. The processor 220 may process (e.g., encode and symbol map) the data and control information to obtain data symbols and control symbols, respectively. The processor 220 may also generate reference symbols, e.g., for the primary synchronization signal (PSS), secondary synchronization signal (SSS), and cell-specific reference signal (CRS). A transmit (TX) multiple-input multiple-output (MIMO) processor 230 may perform spatial processing (e.g., precoding) on the data symbols, the control symbols, and/or the reference symbols, if applicable, and may provide output symbol streams to the transmit (TX) front-end circuits 232a through 232t. Each TX front-end circuit 232 may process a respective output symbol stream (e.g., for OFDM, etc.) to obtain an output sample stream. Each TX front-end circuit may further process (e.g., convert to analog, amplify, filter, and upconvert) the output sample stream to obtain a downlink signal. Downlink signals from TX front-end circuits 232a through 232t may be transmitted via the antennas 234a through 234t, respectively.

At the UE 120, the antennas 252a through 252r may receive the downlink signals from the BS 110 and may provide received signals to the receive (RX) front-end circuits 254a through 254r, respectively. Each RX front-end circuit 254 may condition (e.g., filter, amplify, downconvert, and digitize) a respective received signal to obtain input samples. Each RX front-end circuit may further process the input samples (e.g., for OFDM, etc.) to obtain received symbols. A MIMO detector 256 may obtain received symbols from all the RX front-end circuits 254a through 254r, perform MIMO detection on the received symbols if applicable, and provide detected symbols. A receive processor 258 may process (e.g., demodulate, deinterleave, and decode) the detected symbols, provide decoded data for the UE 120 to a data sink 260, and provide decoded control information to a controller/processor 280.

On the uplink, at UE 120, a transmit processor 264 may receive and process data (e.g., for the physical uplink shared channel (PUSCH)) from a data source 262 and control information (e.g., for the physical uplink control channel (PUCCH) from the controller/processor 280. The transmit processor 264 may also generate reference symbols for a reference signal (e.g., for the sounding reference signal (SRS)). The symbols from the transmit processor 264 may be precoded by a TX MIMO processor 266 if applicable, further processed by the RX front-end circuits 254a through 254r (e.g., for SC-FDM, etc.), and transmitted to the BS 110. At the BS 110, the uplink signals from the UE 120 may be received by the antennas 234, processed by the TX front-end circuits 232, detected by a MIMO detector 236 if applicable, and further processed by a receive processor 238 to obtain decoded data and control information sent by the UE 120.

The receive processor 238 may provide the decoded data to a data sink 239 and the decoded control information to the controller/processor 240.

The controllers/processors 240 and 280 may direct the operation at the BS 110 and the UE 120, respectively. The processor 240 and/or other processors and modules at the BS 110 may perform or direct the execution of processes for the techniques described herein. The memories 242 and 282 may store data and program codes for BS 110 and UE 120, respectively. A scheduler 244 may schedule UEs for data transmission on the downlink and/or uplink. In certain aspects, the TX/RX front-end circuits 232, 254 may include a tuning circuit for adjusting a source impedance seen by a portion of a receive path, as further described herein.

Figure 3:
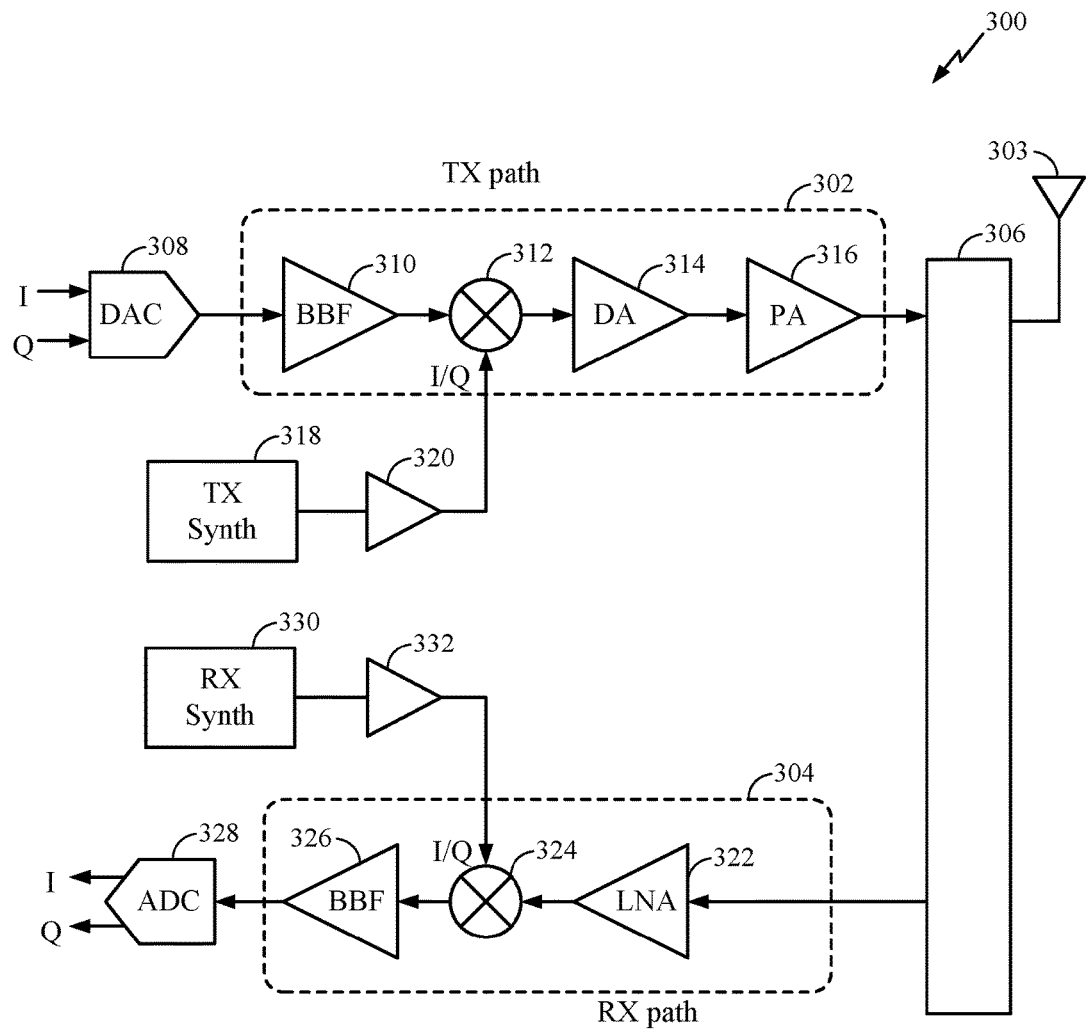
FIG. 3 is a block diagram showing an example transceiver front-end, in accordance with certain aspects of the present disclosure.

FIG. 3 is a block diagram of an example transceiver front-end 300, such as TX/RX front-end circuits 232, 254 in FIG. 2, in which aspects of the present disclosure may be practiced. The transceiver front-end 300 includes at least one transmit (TX) path 302 (also known as a transmit chain) for transmitting signals via one or more antennas and at least one receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be included in the RFIC or external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies between the LO frequency and the frequencies of the baseband signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 may include a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning to different frequencies indicates using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO may be produced by a TX frequency synthesizer 318, which may be buffered or amplified by amplifier 320 before being mixed with the baseband signals in the mixer 312. Similarly, the receive LO may be produced by an RX frequency synthesizer 330, which may be buffered or amplified by amplifier 332 before being mixed with the RF signals in the mixer 324.

Example SAR ADC Chopping

A successive approximation register (SAR) analog-to-digital converter (ADC) is an area- and power-efficient architecture for low to medium accuracy analog-to-digital conversion applications, such as an RX front-end circuit. Comparator flicker noise may dominate the signal output for certain low frequency wireless applications, such as GSM or narrowband carriers used for Internet of Things (NB-IOT) in 4G or 5G wireless networks. Chopping the signal may be used to remove flicker noise without excessively increasing the area and power consumption of the SAR ADC. For example, chopping shifts the input signal to a higher frequency, which enables post-processing to digitally remove unwanted signals such as flicker noise introduced by the comparator. One drawback with chopping at the input of the SAR ADC is that chopping affects the settling of the digital-to-analog converter (DAC) capacitive array. For instance, the sampled charge on the weighted DAC capacitive array may toggle between $+2C_t \cdot \Delta V$ and $-2C_t \cdot \Delta V$, which takes varying times to settle and results in degrading the output signal.

As further described herein for certain aspects of the present disclosure, after sampling and converting the input signal, the SAR ADC may be allowed to redistribute the charge on the DAC capacitive arrays. For example, reference buffers may be used to apply an inverse voltage to each of the capacitors on the array, enabling the capacitors to quickly discharge and prepare for the next sample. The charge redistribution stage described herein enables chopping the SAR ADC input signal without any impact on the signal linearity and amplitude, avoiding the signal degradation caused by chopping without the charge redistribution stage.

Figure 4:
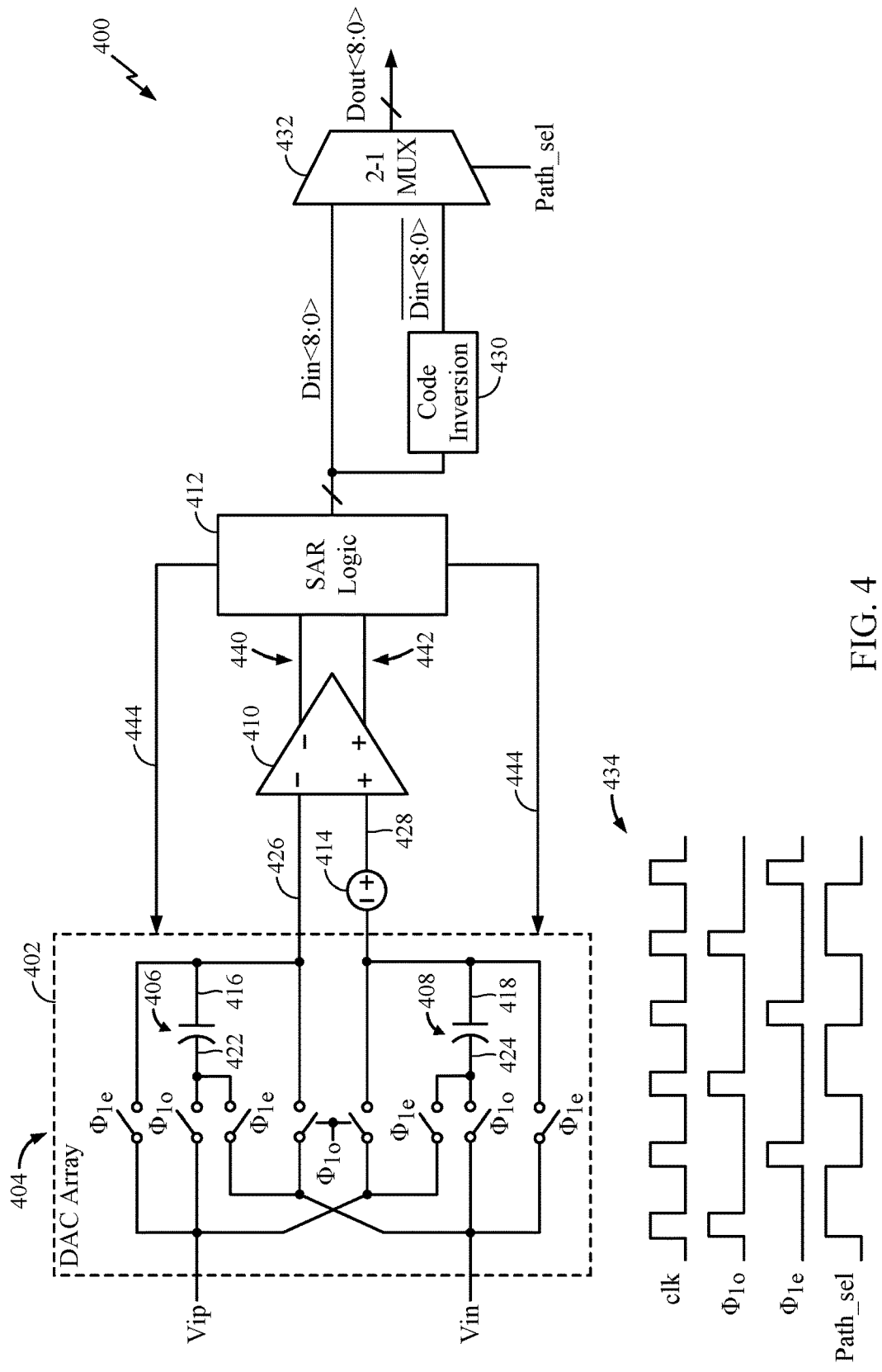
FIG. 4 illustrates an example SAR ADC, in accordance with certain aspects of the present disclosure.

FIG. 4 illustrates an example SAR ADC 400, in accordance with certain aspects of the present disclosure. As shown, the SAR ADC includes a DAC capacitive array 402, a comparator 410, and a SAR logic unit 412. A differential analog input signal (having signal components Vip and Vin) is sampled by one or more switches coupled to the DAC capacitive array 402, for example, when the clock is high; and the analog-to-digital conversion is started, when the clock goes low and the input signal is disconnected. During the conversion phase, a binary search is performed by the comparator 410 and the SAR logic unit 412 to find a digital output using the DAC capacitive array 402. As an example, to resolve n+1 bits, n DAC operations may be performed by the DAC capacitive array 402. Thus, the digital output (Dout) is a digital representation of the analog input voltage including any quantization noise (Q). For certain aspects, noise shaping is performed to reduce the quantization noise by offsetting an input voltage to the comparator 410 by the quantization noise of the previous conversion (i.e., the residue left on the capacitive array) using a voltage offset 414.

The SAR logic unit 412 may be implemented by a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. The SAR logic unit 412 has one or more inputs 440 coupled to one or more outputs 442 of the comparator 410, and one or more outputs 444 coupled to control terminals of switches 404.

For certain aspects, the SAR ADC 400 may also include a code inversion module 430 for inverting the digital output of the SAR logic unit 412 and a multiplexer 432 for selecting between the digital output and the inverted digital output of the SAR ADC 400.

As illustrated, the DAC capacitive array 402 includes chopping switches 404, a first capacitive array 406, and a second capacitive array 408. The first and second capacitive arrays 406, 408 may be implemented as weighted capacitive arrays, such as a binary-weighted capacitive array. A binary-weighted capacitive array includes an array of capacitive elements arranged in parallel branches, each branch having a binary-weighted capacitance value and selected via a switch coupled to the branch. The first capacitive array 406 has a first terminal 416 selectively coupled to a first input 426 of the comparator 410, and likewise, the second capacitive array 408 has a first terminal 418 selectively coupled to a second input 428 of the comparator 410. The first and second capacitive arrays 406, 408 are coupled between the switches 404 and the first and second inputs 426, 428 of the comparator 410, respectively.

The components of the analog input signal ($V_{ip}$ and $V_{in}$) are chopped by switches 404 (associated with different phase signals $\Phi_{1o}$, $\Phi_{1e}$) at the input of the first and second capacitive arrays 406, 408. The switches 404 are controlled by complementary phase signals $\Phi_{1e}$ and $\Phi_{1o}$ depicted by the timing diagrams 434 The phase signal $\Phi_{1o}$ is associated with odd pulses of the clock signal (clk), whereas the phase signal $\Phi_{1e}$ is associated with the even pulses of the clock signal (clk). As previously discussed, chopping shifts the input signal into a higher frequency, which enables, for example, filtering out comparator flicker noise.

Figure 5A:
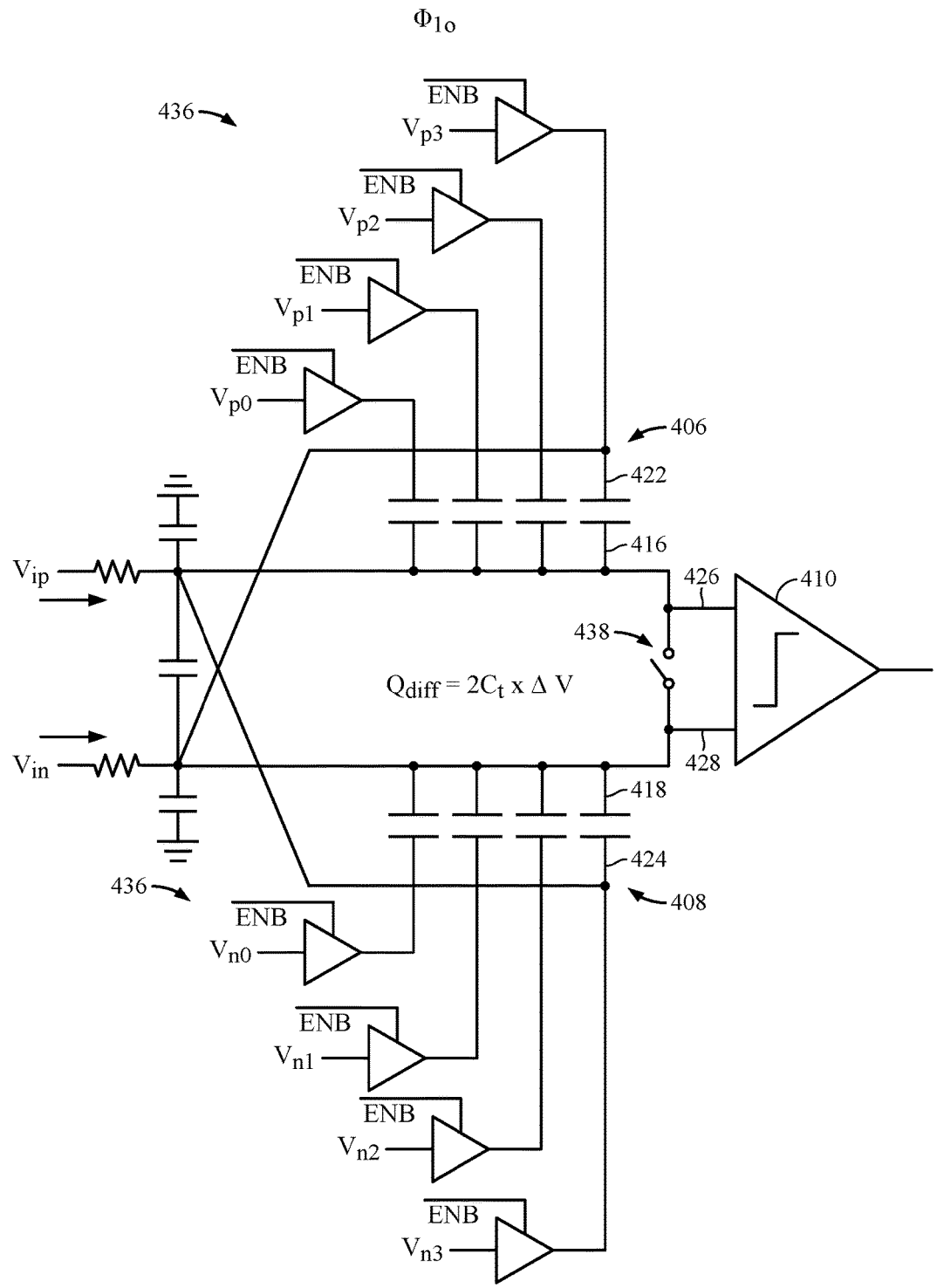
FIGS. 5A and 5B illustrate certain elements of the example SAR ADC, in accordance with certain aspects of the present disclosure.
Figure 5B:
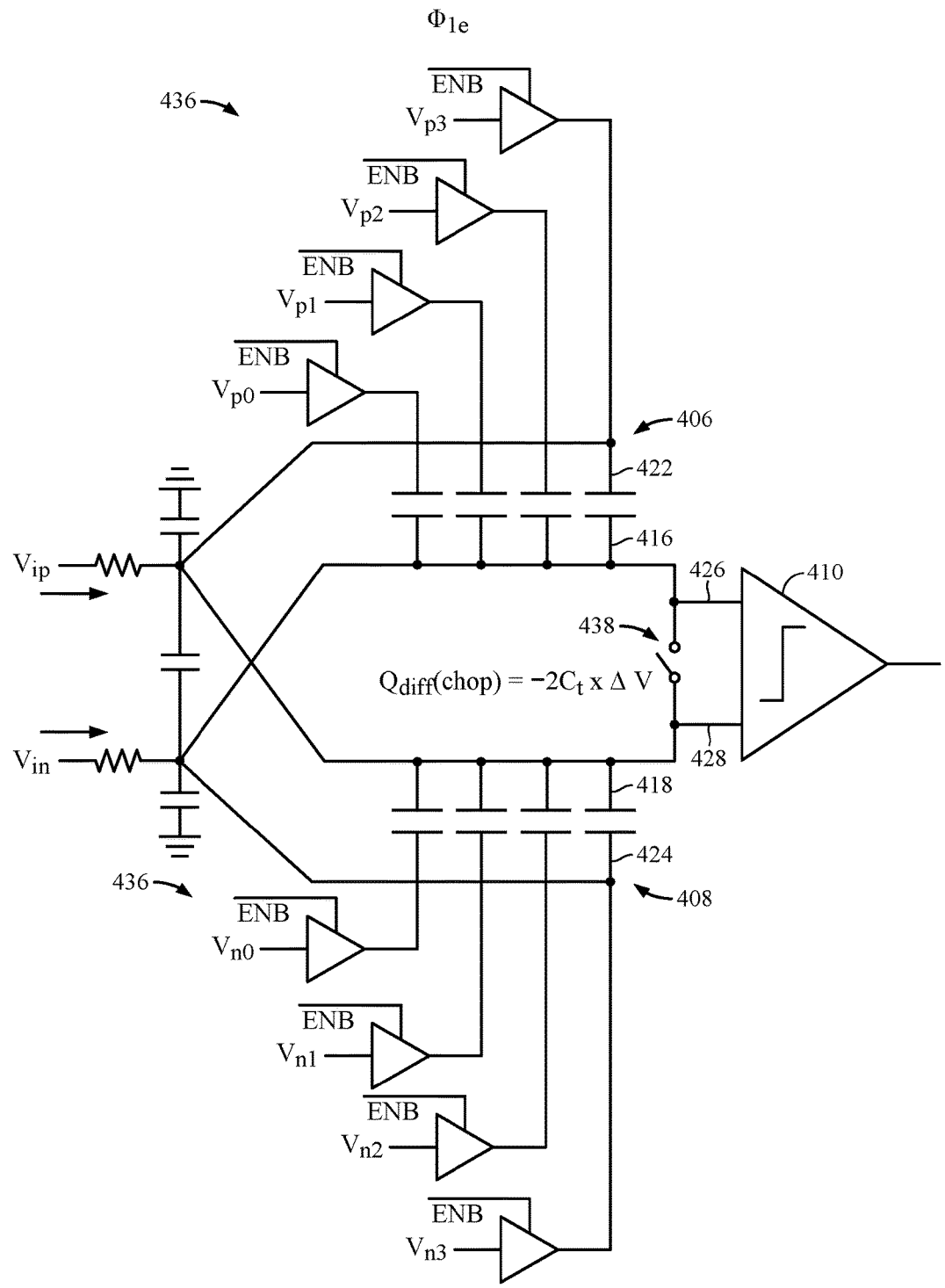

FIGS. 5A and 5B illustrate certain elements of the example SAR ADC 400 used to chop the differential input signal ($V_{ip}$ and $V_{in}$), in accordance with certain aspects of the present disclosure. As shown in FIGS. 5A and 5B, the SAR ADC 400 also includes reference buffers 436 and a switch 438. The reference buffers 436 are selectively coupled to second terminals 422, 424 of the first and second capacitive elements in the first and second capacitive arrays 406, 408, respectively. Each of the reference buffers 436 may be implemented as a buffer having tri-state logic and a low output impedance (e.g., a tri-state buffer). For certain aspects, each of the reference buffers 436 may have inverter logic. As illustrated in FIGS. 5A and 5B, the SAR ADC 400 may implement chopping by applying the components of the differential signal ($V_{ip}$ and $V_{in}$) to both sets of plates of the capacitive arrays 406, 408 (terminals 416, 418, 422, 424). In this example, the SAR ADC 400 may be referred to as "a doubler."

As shown in FIG. 5A, during the odd phase $\Phi_{1o}$ of chopping the input signal ($V_{ip}$ and $V_{in}$), the switches 404 (FIG. 4) conduct the voltage $V_{ip}$ to the first terminals 416 and second terminals 424 of the capacitive elements in the capacitive arrays 406, 408 and conduct the voltage $V_{in}$ to the second terminals 422 and first terminals 418 of the capacitive elements in the capacitive arrays 406, 408. As an example, the capacitive arrays 406, 408 may be charged to $+2C_t \cdot \Delta V$ during the conversion phase. After the conversion phase, the capacitive arrays 406, 408 may redistribute their charges using the reference buffers 436.

The reference buffers 436 apply inverse digital codes to the second terminals 422, 424 of the capacitive elements in the first and second capacitive arrays 406, 408. The switch 438 is coupled between the first and second inputs 426, 428 of the comparator 410. The switch 438 shorts the first and second inputs 426, 428 of the comparator 410 while the inverse digital codes (e.g., $V_{p0} \ldots V_{p3}, V_{n0} \ldots V_{n3}$) are being applied to the first and second capacitive arrays 406, 408, such that charges of the first and second capacitive arrays 406, 408 are redistributed among the capacitive elements in the capacitive arrays 406, 408. This enables the capacitive arrays 406, 408 to quickly reset their charges to $-2C_t \cdot \Delta V$ in preparation for the even phase $\Phi_{1e}$ of chopping.

As shown in FIG. 5B, during the even phase $\Phi_{1e}$ of chopping the input signal ($V_{ip}$ and $V_{in}$), the switches 404 (FIG. 4) conduct the voltage $V_{ip}$ to the second terminals 422 and first terminals 418 of the capacitive elements in the capacitive arrays 406, 408 and conduct the voltage $V_{in}$ to the first terminals 416 and second terminals 424 of the capacitive elements in the capacitive arrays 406, 408. As an example, the capacitive arrays 406, 408 may be charged to $-2C_t \cdot \Delta V$ during the conversion phase. After the conversion phase, the capacitive arrays 406, 408 may redistribute their charges using the reference buffers 436 and switch 438 as discussed above.

Figure 6:
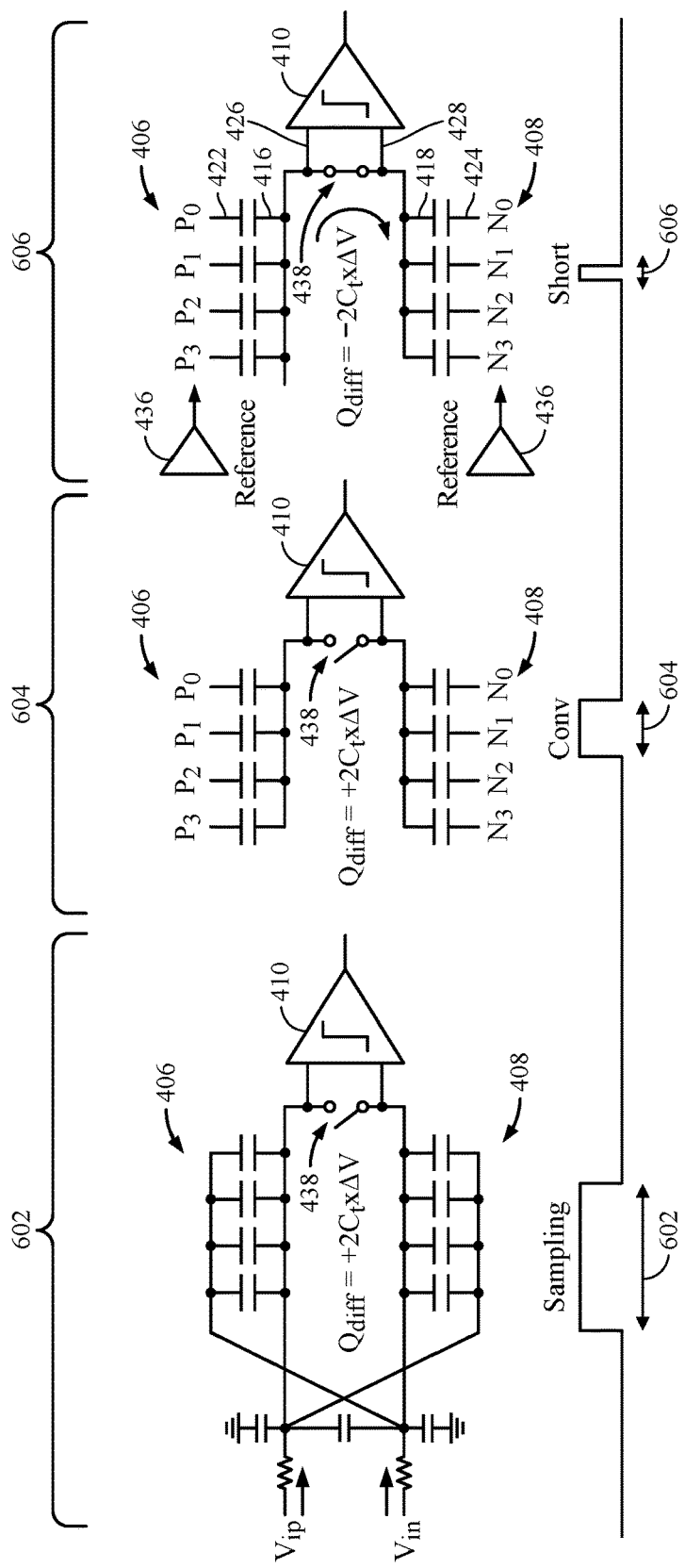
FIG. 6 is an example timing diagram illustrating the charge redistribution of capacitive arrays included in the example SAR ADC, in accordance with certain aspects of the present disclosure.

FIG. 6 is an example state diagram illustrating the charge redistribution of the capacitive arrays 406, 408 relative to the sampling and conversion phases, in accordance with certain aspects of the present disclosure. As shown, the SAR ADC initially samples the differential input signal ($V_{ip}$ and $V_{in}$) during the sampling phase 602, and the SAR ADC performs the analog-to-digital conversion during the conversion phase 604. At the charge redistribution phase 606, before proceeding with the conversion of the next sample, the SAR ADC redistributes the charges stored in the capacitive arrays 406, 408 by applying inverse digital codes to each of the capacitors of the capacitive arrays 406, 408.

In this example, at the charge redistribution phase 606, the switch 438 shorts the first and second inputs 426, 428 of the comparator 410 while the inverse codes are being applied to the second terminals 422, 424 of the first and second capacitive arrays 406, 408 to redistribute charges of the first and second capacitive arrays. That is, the reference buffers 436 and the switch 438 may redistribute charges of the first and second capacitive arrays 406, 408 after an input signal ($V_{ip}$ and $V_{in}$) is converted to digital codes using the first and second capacitive arrays 406, 408 as shown in the sampling and conversion phases 602 and 606. As shown in FIG. 6, the charge redistribution is fast and efficient may take less than 1/10 of the sampling window. The inverse digital codes (e.g., $\overline{P_0} \ldots \overline{P_0}, \overline{N_0} \ldots \overline{N_0}$) may be inverted voltages of the first and second capacitive arrays indicative of a digital code representing an input signal applied to the ADC (e.g., $P_3 \ldots P_0, N_3 \ldots N_0$).

The durations of time for the phases 602, 604, 606 depicted in FIG. 6 are merely examples, representing that the redistribution phase 606 may be shorter in duration than the sampling phase 602 and/or the conversion phase 604. The durations for each phase 602, 604, 606 may vary. For example, the duration of the sampling phase 602 may be shorter than the duration of the conversion phase 604.

The duration of time between the phases 602, 604, and 606 depicted in FIG. 6 merely indicates the serial order of these phases. These durations are not drawn to scale. For certain aspects, these durations may be significantly shorter, or there may be no time between the phases 602, 604, and 606, such that they occur immediately after one another.

Figure 7:
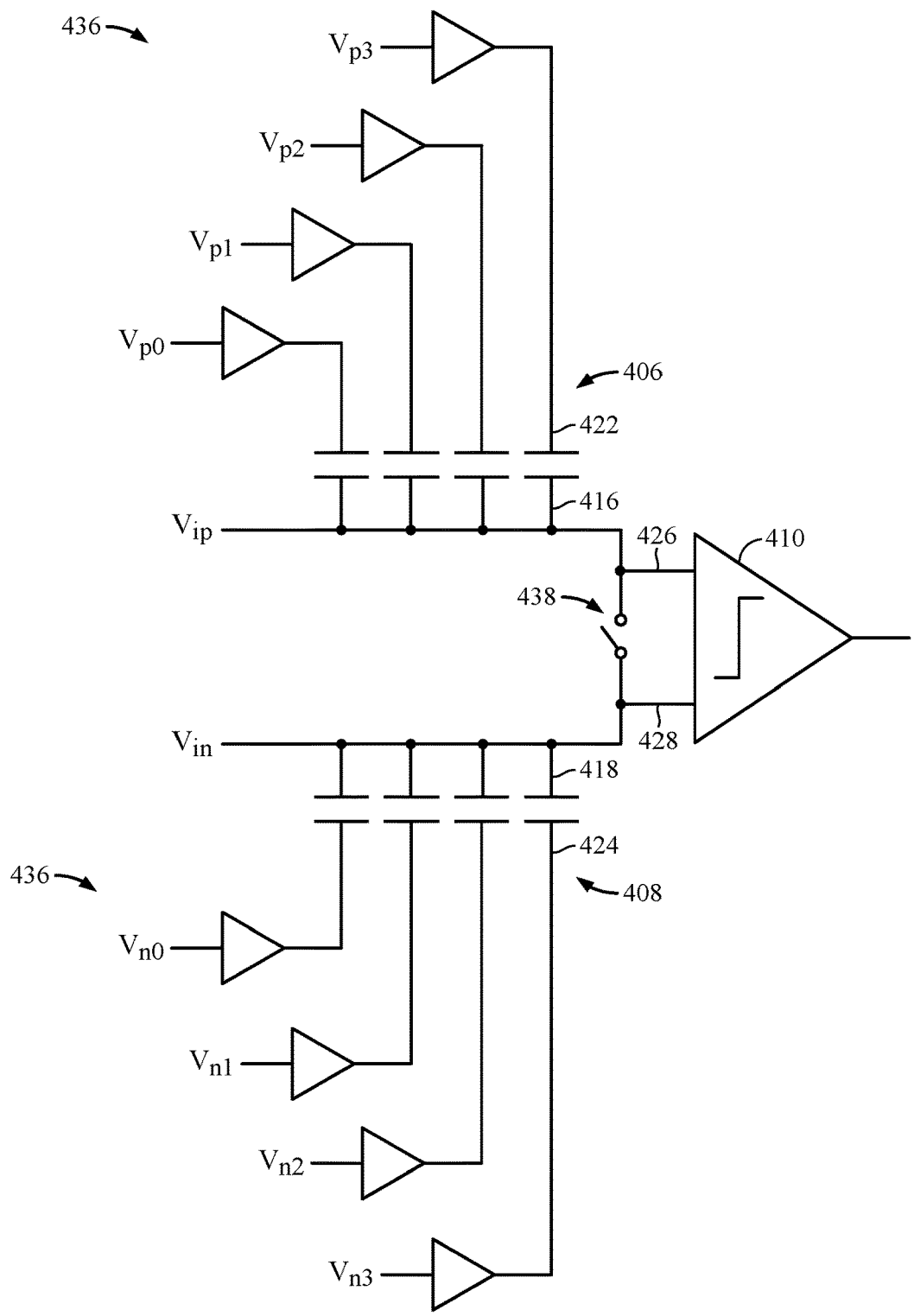
FIG. 7 illustrates certain elements of an example SAR ADC, in accordance with certain aspects of the present disclosure.

In certain aspects, the components of the differential input signal may be applied separately to the plates of the capacitive arrays. That is, instead of applying both components of the differential signal to compare complementary voltage drops (i.e., ($V_{ip}-V_{ip}$) and ($V_{ip}-V_{ip}$)), the SAR ADC may compare the components of the differential signal relative to a reference voltage (e.g., ($V_{ip}-V_{ref}$) and ($V_{in}-V_{ref}$)). For example, FIG. 7 illustrates certain elements of the example SAR ADC 400, where the components of the differential signal ($V_{ip}$ and $V_{in}$) are applied to each input 426, 428 of the comparator 410, separately, in accordance with certain aspects of the present disclosure. As shown, the components of the differential signal ($V_{ip}$ and $V_{in}$) may be applied to the first terminals 416, 418 of the capacitive elements in the capacitive arrays 406, 408. During the redistribution phase, the reference buffers 436 may apply the inverse digital codes ($V_{p0} \ldots V_{p3}, V_{n0} \ldots V_{n3}$) to the capacitive arrays 406, 408. The components of the differential signal ($V_{ip}$ and $V_{in}$) may be reversed for the complementary chopping phase.

Figure 8:
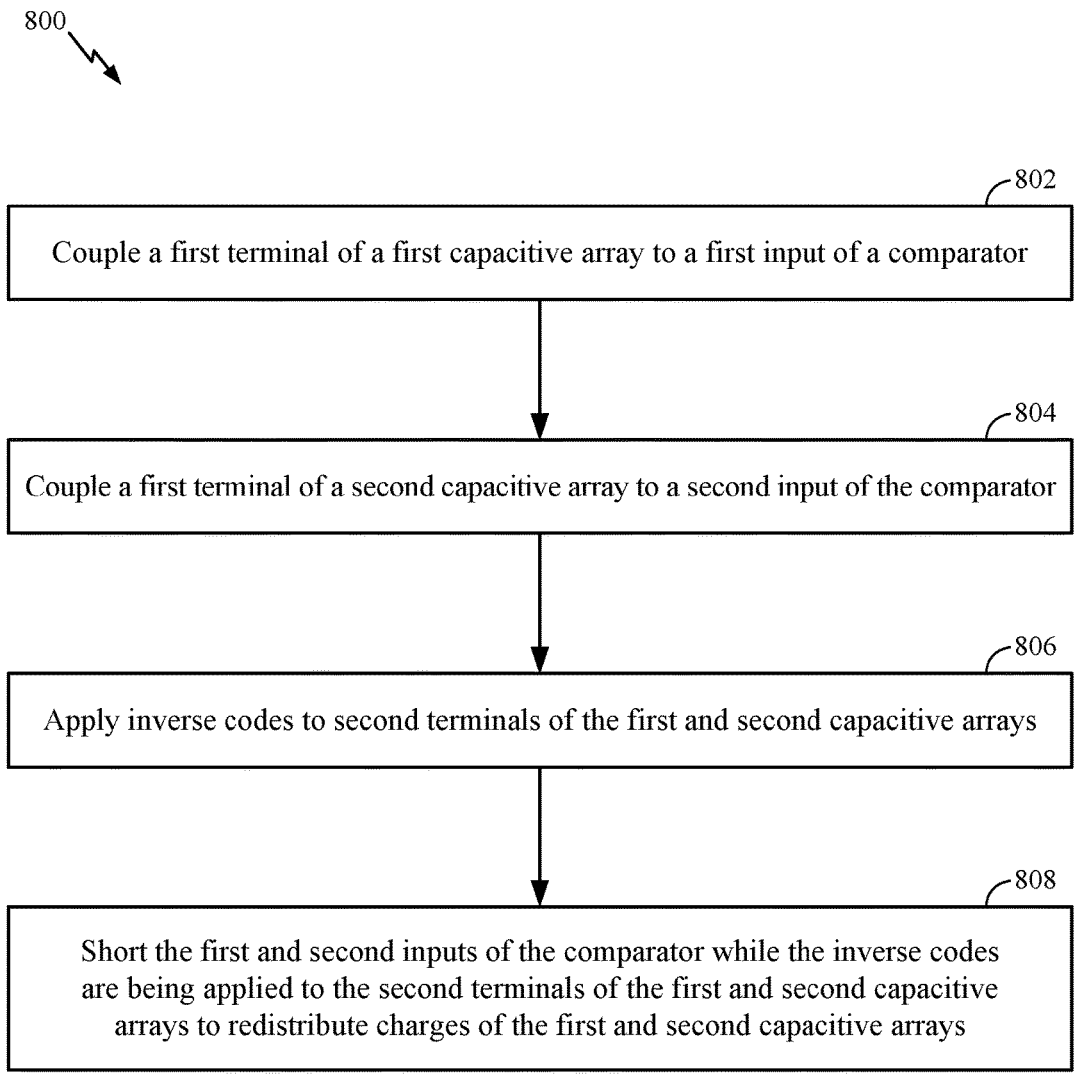
FIG. 8 is a flow diagram of example operations for chopping an input signal applied to an example SAR ADC, in accordance with certain aspects of the present disclosure

FIG. 8 is a flow diagram illustrating example operations 800 for chopping the differential signal, in accordance with certain aspects of the present disclosure. The operations 800 may be performed, for example, by a SAR ADC (e.g., SAR ADC 400).

The operations 800 may begin, at block 802, where the SAR ADC couples a first terminal of a first capacitive array to a first input of a comparator. For example, the terminal 416 of the first capacitive array 406 may couple to the first input 426 of the comparator 410.

At block 804, the SAR ADC couples a first terminal of a second capacitive array to a second input of the comparator. For example, the terminal 418 of the second capacitive array 408 may couple to the second input 428 of the comparator 410.

At block 806, the SAR ADC applies inverse codes to second terminals of the first and second capacitive arrays. For example, the reference buffers 436 may apply inverse codes to the second terminals 422, 424 of the first and second capacitive arrays 406. Applying the inverse codes may include inverting digital codes via the reference buffer 436.

At block 808, the SAR ADC shorts the first and second inputs of the comparator while the inverse codes are being applied to the second terminals of the first and second capacitive arrays to redistribute charges of the first and second capacitive arrays. For example, the switch 438 may couple the inputs 426, 428 of the comparator 410 together while the inverse codes are being applied by the reference buffer 436.

In certain aspects, the operations 800 may include converting an input signal to digital codes using the first and second capacitive arrays before applying the inverse codes and shorting the first and second inputs. For example, at the sampling and conversion phases 602 and 604 of FIG. 6, the SAR ADC 400 may convert the input signal to digital codes ($P_3 \ldots P_0, N_3 \ldots N_0$) using the first and second capacitive arrays 406, 408 before applying the inverse codes and shorting the first and second inputs of the comparator 410.

For certain aspects, the operations 800 may also include chopping an input signal applied to the ADC by the first and second capacitive arrays. Chopping may include, for example, as shown in FIGS. 5A and 5B, alternating between (1) applying the input signal at a first input terminal of the ADC (e.g., $V_{ip}$) to the first terminal of the first capacitive array and to the second terminal of the second capacitive array and applying the input signal at a second input terminal of the ADC (e.g., $V_{in}$) to the second terminal of the first capacitive array and to the first terminal of the second capacitive array; and (2) applying the input signal at the first input terminal of the ADC (e.g., $V_{ip}$) to the second terminal of the first capacitive array and to the first terminal of the second capacitive array and applying the input signal at the second input terminal of the ADC (e.g., $V_{in}$) to the first terminal of the first capacitive array and to the second terminal of the second capacitive array. For other aspects, chopping may include, for example, as shown in FIG. 7, alternating between (1) applying the input signal at a first input terminal of the ADC (e.g., $V_{ip}$) to the first terminal of the first capacitive array and applying the input signal at a second input terminal of the ADC (e.g., $V_{in}$) to the first terminal of the second capacitive array; and (2) applying the input signal at the first input terminal of the ADC to the first terminal of the second capacitive array and applying the input signal at the second input terminal of the ADC to the first terminal of the first capacitive array.

It should be appreciated that the chopping technique described herein enables a SAR ADC to reduce the effects of input settling of the capacitive arrays without any impact on the signal linearity and amplitude. In addition, the SAR ADC described herein is capable of chopping the input signal having an architecture that is efficient with regard to surface area and power consumption.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

For example, means for comparing may include a comparator, such as the comparator 410. Means for shorting may include a switch, such as the switch 438. Means for sampling and converting a component of a differential signal pair may include a capacitive array, such as the capacitive arrays 406, 408. Means for selectively applying inverse digital codes may include a reference buffer, such as the reference buffers 436. Means for chopping an input signal may include a plurality of switches, such as the switches 404.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules, and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. An analog-to-digital converter (ADC) comprising:
a comparator comprising a first input and a second input;

a switch connected between the first and second inputs of the comparator;

a first capacitive array having a first terminal coupled to the first input of the comparator;

a second capacitive array having a first terminal coupled to the second input of the comparator; and a reference buffer selectively coupled to second terminals of the first and second capacitive arrays and configured to apply inverse digital codes to the first and second capacitive arrays, wherein the switch is configured to short the first and second inputs of the comparator while the inverse digital codes are being applied to the first and second capacitive arrays such that charges of the first and second capacitive arrays are redistributed via the reference buffer.

2. The ADC of claim 1, wherein the reference buffer comprises tri-state logic.

3. The ADC of claim 1, wherein the inverse digital codes are inverted voltages of the first and second capacitive arrays indicative of a digital code representing an input signal applied to the ADC.

4. The ADC of claim 1, wherein the first and second capacitive arrays are digital-to-analog converter capacitive arrays.

5. The ADC of claim 1, further comprising a plurality of switches configured to chop an input signal applied to the first and second capacitive arrays.

6. The ADC of claim 5, further comprising logic having:
one or more inputs coupled to one or more outputs of the comparator; and
one or more outputs coupled to control terminals of the plurality of switches.

7. The ADC of claim 5, wherein the first and second capacitive arrays are coupled between the plurality of switches and the first and second inputs of the comparator.

8. The ADC of claim 1, wherein the reference buffer and the switch are configured to redistribute charges of the first and second capacitive arrays after an input signal is converted to digital codes using the first and second capacitive arrays.

9. A method for converting an analog signal to a digital signal using an analog-to-digital converter (ADC), comprising:
coupling a first terminal of a first capacitive array to a first input of a comparator;
coupling a first terminal of a second capacitive array to a second input of the comparator;
applying inverse codes to second terminals of the first and second capacitive arrays; and
shorting together the first and second inputs of the comparator while the inverse codes are being applied to the second terminals of the first and second capacitive arrays to redistribute charges of the first and second capacitive arrays.

10. The method of claim 9, wherein applying the inverse codes comprises inverting digital codes via a reference buffer.

11. The method of claim 9, further comprising applying an input signal to the ADC, wherein the inverse codes are inverted voltages of the first and second capacitive arrays indicative of a digital code representing the input signal applied to the ADC.

12. The method of claim 9, further comprising chopping an input signal applied to the ADC with the first and second capacitive arrays by alternating between:
applying the input signal at a first input terminal of the ADC to the first terminal of the first capacitive array and to the second terminal of the second capacitive array and applying the input signal at a second input terminal of the ADC to the second terminal of the first capacitive array and to the first terminal of the second capacitive array; and
applying the input signal at the first input terminal of the ADC to the second terminal of the first capacitive array and to the first terminal of the second capacitive array and applying the input signal at the second input terminal of the ADC to the first terminal of the first capacitive array and to the second terminal of the second capacitive array.

13. The method of claim 9, further comprising chopping an input signal applied to the ADC by the first and second capacitive arrays by alternating between:
applying the input signal at a first input terminal of the ADC to the first terminal of the first capacitive array and applying the input signal at a second input terminal of the ADC to the first terminal of the second capacitive array; and
applying the input signal at the first input terminal of the ADC to the first terminal of the second capacitive array and applying the input signal at the second input terminal of the ADC to the first terminal of the first capacitive array.

14. The method of claim 9, further comprising converting an input signal to digital codes using the first and second capacitive arrays before applying the inverse codes and shorting the first and second inputs.

15. An apparatus for analog-to-digital conversion, comprising:
means for comparing a first input and a second input;
means for shorting the first input and the second input together;
first means for sampling and converting a first component of a differential signal pair coupled to the first input of the means for comparing;
second means for sampling and converting a second component of the differential signal pair coupled to the second input of the means for comparing; and
means for selectively applying inverse digital codes to the first and second means for sampling and converting, wherein the means for shorting is configured to short the first and second inputs of the means for comparing while the inverse digital codes are being applied to the first and second means for sampling and comparing such that charges of the first and second means for sampling and converting are redistributed via the means for selectively applying inverse digital codes.

16. The apparatus of claim 15, wherein the means for selectively applying inverse digital codes comprises means for buffering a reference signal applied to the first and second means for sampling and converting.

17. The apparatus of claim 15, wherein the inverse digital codes are inverted voltages of the first and second means for sampling and converting indicative of a digital code representing the differential signal pair applied to the apparatus.

18. The apparatus of claim 15, further comprising means for chopping the differential signal pair applied to the apparatus by alternatively applying the differential signal pair or an inverse of the differential signal pair to each of the first and second means for sampling and converting.

19. The apparatus of claim 18, further comprising means for controlling the means for chopping based on one or more outputs of the means for comparing.

20. The apparatus of claim 15, wherein the means for selectively applying inverse digital codes and the means for shorting are configured to redistribute charges of the first and second means for sampling and converting after the differential signal pair is converted to digital codes using the first and second means for sampling and converting.

* * * * *